(12) United States Patent
Ryding

(10) Patent No.: US 6,864,494 B2
(45) Date of Patent: *Mar. 8, 2005

(54) SEMICONDUCTOR PROCESSING APPARATUS HAVING A MOVING MEMBER AND A FORCE COMPENSATOR THEREFOR

(75) Inventor: Geoffrey Ryding, Manchester, MA (US)

(73) Assignee: Applied Materials, Inc., Santa Clara, CA (US)

(*) Notice: Subject to any disclaimer, the term of this patent is extended or adjusted under 35 U.S.C. 154(b) by 41 days.

This patent is subject to a terminal disclaimer.

(21) Appl. No.: 09/956,247

(22) Filed: Sep. 20, 2001

(65) Prior Publication Data

US 2002/0088949 A1 Jul. 11, 2002

Related U.S. Application Data

(63) Continuation-in-part of application No. 09/293,956, filed on Apr. 19, 1999, now Pat. No. 6,350,991.

(51) Int. Cl.[7] .......................... H01J 37/20; H01J 37/317
(52) U.S. Cl. .............................. 250/492.21; 250/442.11
(58) Field of Search ....................... 250/492.21, 442.11, 250/441.11; 384/8

(56) References Cited

U.S. PATENT DOCUMENTS

| 4,191,385 A | 3/1980 | Fox |
| 4,726,689 A | 2/1988 | Pollock |
| 5,003,183 A | 3/1991 | Nogami et al. |
| 5,229,615 A | 7/1993 | Brune et al. |
| 5,898,179 A | 4/1999 | Smick et al. |
| 6,172,372 B1 | 1/2001 | Vanderpot |
| 6,350,991 B1 * | 2/2002 | Ryding ................. 250/492.21 |

FOREIGN PATENT DOCUMENTS

| JP | 3-245448 A | 11/1999 |
| WO | 99/13488 | 3/1999 |

* cited by examiner

*Primary Examiner*—Jack I. Berman
(74) *Attorney, Agent, or Firm*—Boult Wade Tennant

(57) ABSTRACT

A force compensator is provided for a semiconductor processing apparatus having a moving member, in order to compensate for a fixed force on the moving member, such as gravity or atmospheric pressure. A vacuum and piston combination is connected between the movable member and a reaction point. One side of the piston is open to atmosphere and the other side defines an enclosed region which is evacuated. The cylinder is evacuated to a pressure which does not exceed 10% of ambient pressure during operation of the device, so that pressure changes in the low pressure region have minimal effect on the compensation force during movement of the movable member over its displacement range.

8 Claims, 6 Drawing Sheets

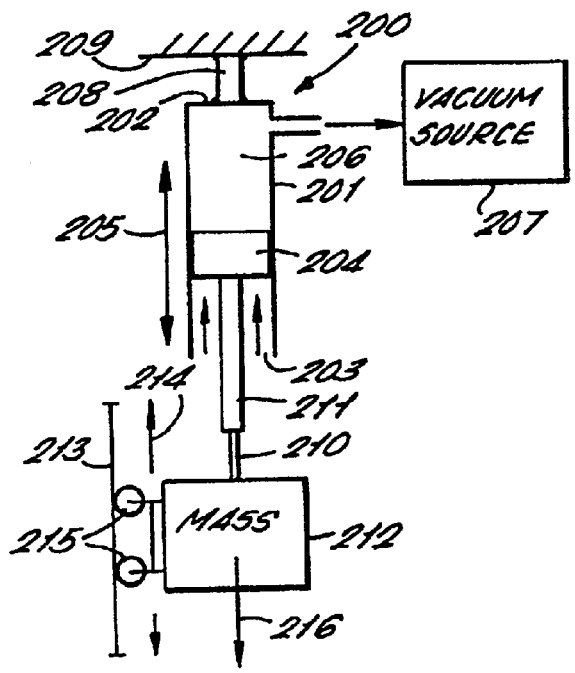
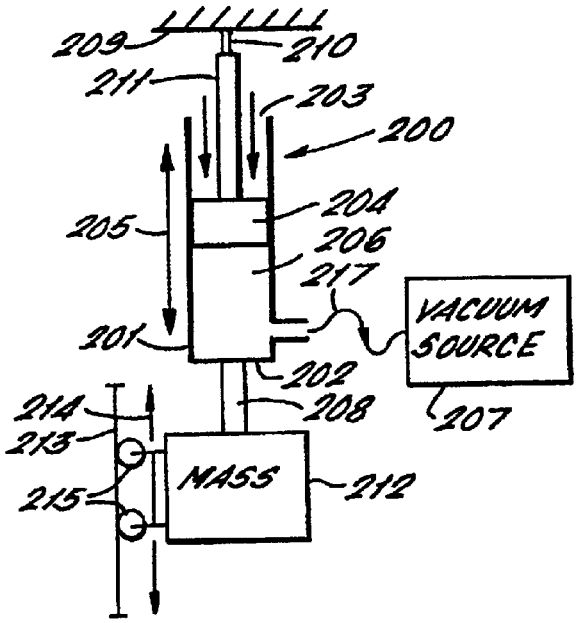
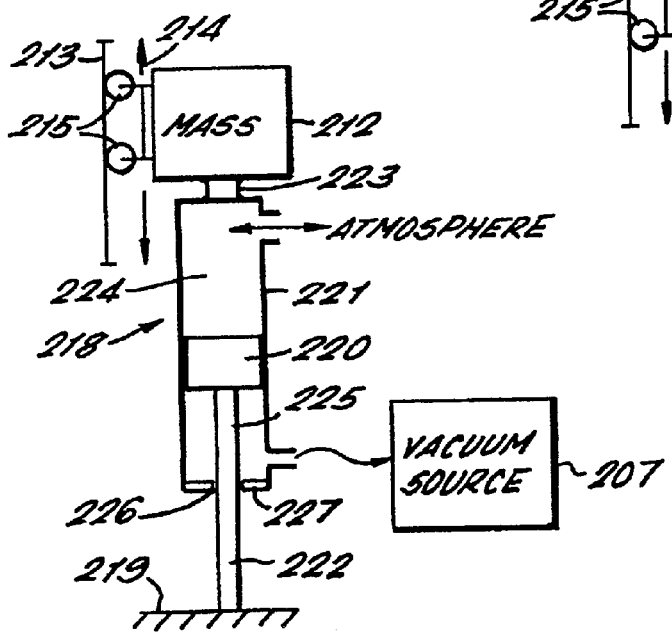

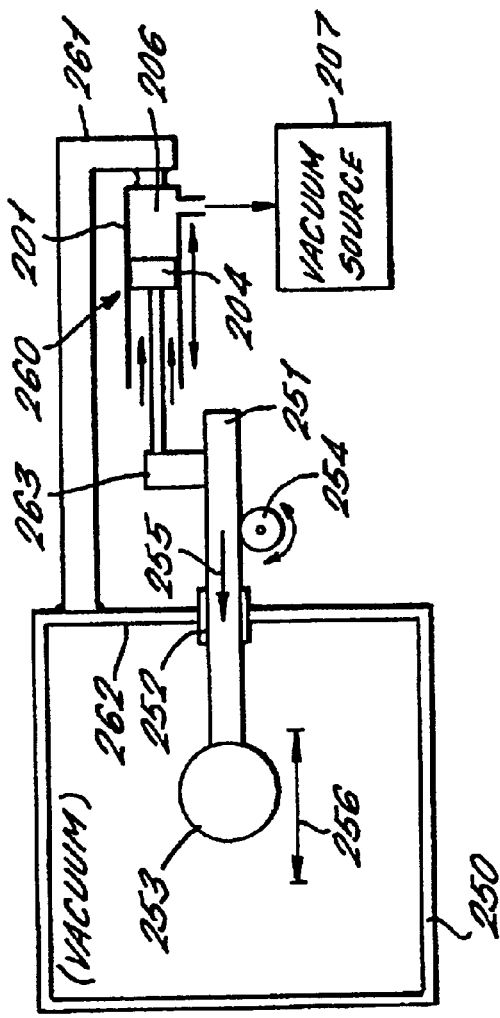
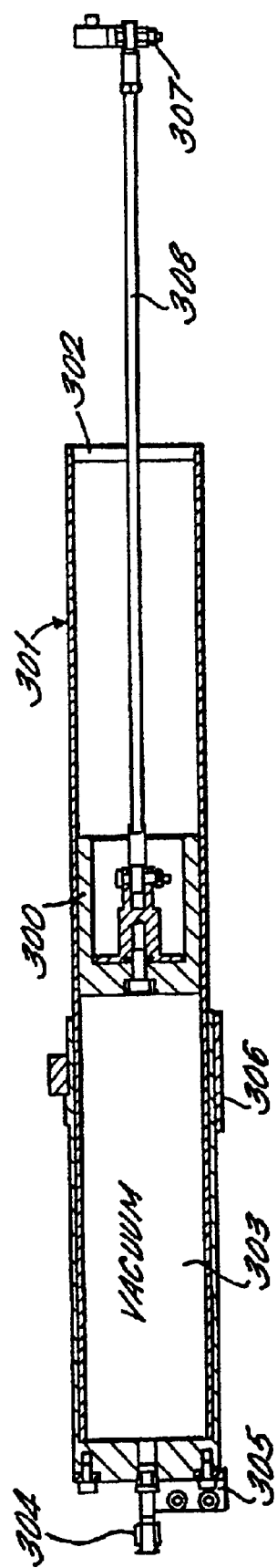

SEMICONDUCTOR PROCESSING APPARATUS HAVING A MOVING MEMBER AND A FORCE COMPENSATOR THEREFOR

This application is a continuation-in-part of application Ser. No. 09/293,956 filed on Apr. 19, 1999 now U.S. Pat. No. 6,350,991, of which are hereby incorporated by reference.

FIELD OF THE INVENTION

This invention relates to semiconductor processing apparatus having a moving member and in particular to a force compensation therefor.

BACKGROUND OF THE INVENTION

Many kinds of semiconductor processing apparatus include a moving member. For example, a member may be provided to hold and translate the position of a semiconductor wafer for processing. An ion implanter, for example, is known from U.S. Pat. No. 5,898,179, in which the wafer is mounted upon a substrate holder in a process chamber. Attached to, or integral with, the substrate holder is an arm which extends through an aperture in the wall of the vacuum chamber. Mechanical scanning is effected by a scanning mechanism located outside the process chamber. The scanning mechanism is connected with the arm of the substrate holder and allows movement of the arm and hence the substrate holder relative to the process chamber.

Typically, the arm is substantially horizontal and is moved up and down in a reciprocating motion by a servo driven linear motor. Since the arm and substrate holder have significant combined mass, the effect of gravity on this mass makes it difficult for the servo and motor to provide precise velocity control throughout the upward and downward strokes.

In the ion implanter of U.S. Pat. No. 5,898,179, gravity provides a constant downward force on the arm and substrate holder.

Gravity is not the only possible cause of a constant force applied to a movable member. For example, when an elongate member extends into a vacuum chamber and is movable longitudinally, atmospheric pressure applies a constant inward force to the member.

In U.S. Pat. No. 4,726,689, a wafer holder is mounted in a vacuum chamber on a vertically aligned shaft which is longitudinally movable, the cross-section of the shaft is matched to the weight of the movable assembly, so that the downward force of gravity is counterbalanced by the upward force of atmospheric pressure.

In U.S. Pat. No. 6,172,372, the downward force of gravity on a vertically aligned shaft which penetrates opposite walls of a vacuum chamber is counterbalanced by a pneumatic actuator or hydraulic piston in which a constant internal pressure is maintained via a back relieving pressure regulator connected with a fluid supply or a constant pressure fluid supply pressurised by hydraulics or pneumatics. Counterbalancing is also provided to a system in which a longitudinally movable shaft protrudes through only one wall of a vacuum chamber.

It is an object of the present invention to provide a force compensator for applying a substantially constant force to a movable member over a displacement range which avoids the need to maintain a constant pressure in a pneumatic or hydraulic piston.

SUMMARY OF THE INVENTION

Accordingly, the present invention provides semiconductor processing apparatus having a base and a movable member, said movable member having a mass and being mounted for reciprocation relative to the base over a displacement range having a vertical component, and a force compensator for applying a substantially constant compensation force to said movable member over said displacement range to compensate at least partially for the force of gravity on said mass of said member, said force compensator comprising, a vacuum cylinder having a closed end and an open end, a piston movable in said cylinder over a stroke, said piston defining an enclosed region between said piston and said closed end, said open end being open to ambient atmosphere, a source of vacuum connected to said enclosed region, said source being arranged to provide in said enclosed region a vacuum pressure which remains not above about 10% of normal ambient pressure, a first connecting point associated with said cylinder, and a second connection point associated with said piston, one of said first and second connecting points being connected to said movable member and the other of said connecting points being connected to said base, whereby movement of said movable member relative to said base over said displacement range causes movement of said piston in said cylinder over said stroke.

The invention further provides semiconductor processing apparatus having a vacuum chamber with a chamber wall, and a movable elongate member extending through said chamber wall and being mounted for reciprocation relative to said chamber wall in a longitudinal direction of the member over a displacement range, whereby ambient pressure outside said chamber applies a longitudinal inwardly directed pressure force on said member over said displacement range, and a force compensator for applying a substantially constant compensation force to said movable member over said displacement range to compensate at least partially for said pressure force, said force compensator comprising, a vacuum cylinder having a closed end and an open end, a piston movable in said cylinder over a stroke, said piston defining an enclosed region between said piston and said closed end, said open end being open to ambient atmosphere, a source of vacuum connected to said enclosed region, said source being arranged to provide in said enclosed region a vacuum pressure which remains not above about 10% of normal ambient pressure, a first connecting point associated with said cylinder, and a second connection point associated with said piston, one of said first and second connecting points being connected to said elongate movable member and the other of said connecting points being connected to said chamber wall, whereby movement of said elongate member relative to said chamber wall over said displacement range causes movement of said piston in said cylinder over said stroke.

It will be appreciated that the concept of the invention is applicable outside the field of semiconductor processing apparatus, wherever there is a requirement to provide a substantially constant compensation force over a displacement range.

Accordingly, the invention also provides a force compensator for applying a substantially constant force over a predetermined displacement range, the compensator comprising, a vacuum cylinder having a closed end and an open end, a piston movable in said cylinder over a stroke, said piston defining an enclosed region between said piston and said closed end, said open end being open to ambient atmosphere, a source of vacuum connected to said enclosed region, said source being arranged to provide in said enclosed region a vacuum pressure which remains not above about 10% of normal ambient pressure, a first connecting point associated with said cylinder, and a second connection point associated with said piston, whereby relative displacement of said first and second connecting points over said displacement range causes movement of said piston in said cylinder over said stroke.

By maintaining a pressure in the enclosed region not above about 10% of ambient pressure, the compensation force applied remains within 10% of a set force determined by the ambient pressure and the cross-sectional area of the piston. Accordingly the term "substantially constant force" used herein means a force which canvary, during use of the force compensator over the displacement range, between about 90% and 100% of the above referred set force. Typically ambient pressure will be atmospheric pressure but other constant ambient pressure environments can be contemplated.

More generally therefore, the invention provides a force compensator for applying a substantially constant force over a predetermined displacement range, the compensator comprising, a vacuum cylinder having a closed end and an open end, a piston movable in said cylinder over a stroke, said piston defining an enclosed region between said piston and said closed end, said open end being open to ambient atmosphere, a source of vacuum connected to said enclosed region, said source being arranged to provide in said enclosed region a vacuum pressure which remains not above a percentage of normal ambient pressure which is sufficiently small that said force applied remains within about 10% of a desired force, a first connecting point associated with said cylinder, and a second connection point associated with said piston, whereby relative displacement of said first and second connecting points over said displacement range causes movement of said piston in said cylinder over said stroke.

BRIEF DESCRIPTION OF THE DRAWINGS

The invention may be put into practice in a number of ways, and various embodiments will now be described by way of example only and with reference to the accompanying figures in which:

FIG. 6 is a schematic view of a first arrangement of force compensator counteracting the force of gravity;

FIG. 7 is a schematic diagram of a second arrangement of force compensator counteracting gravity;

FIG. 8 is a schematic diagram of a third arrangement of force compensator counteracting gravity;

FIG. 9 is a schematic diagram of a force compensator counteracting the force of atmospheric pressure; and FIG. 10 is a cross-sectional view of a vacuum and piston combination for a force compensator for use in embodiments of the invention.

DESCRIPTION OF THE PREFERRED EMBODIMENT

Figure 1:
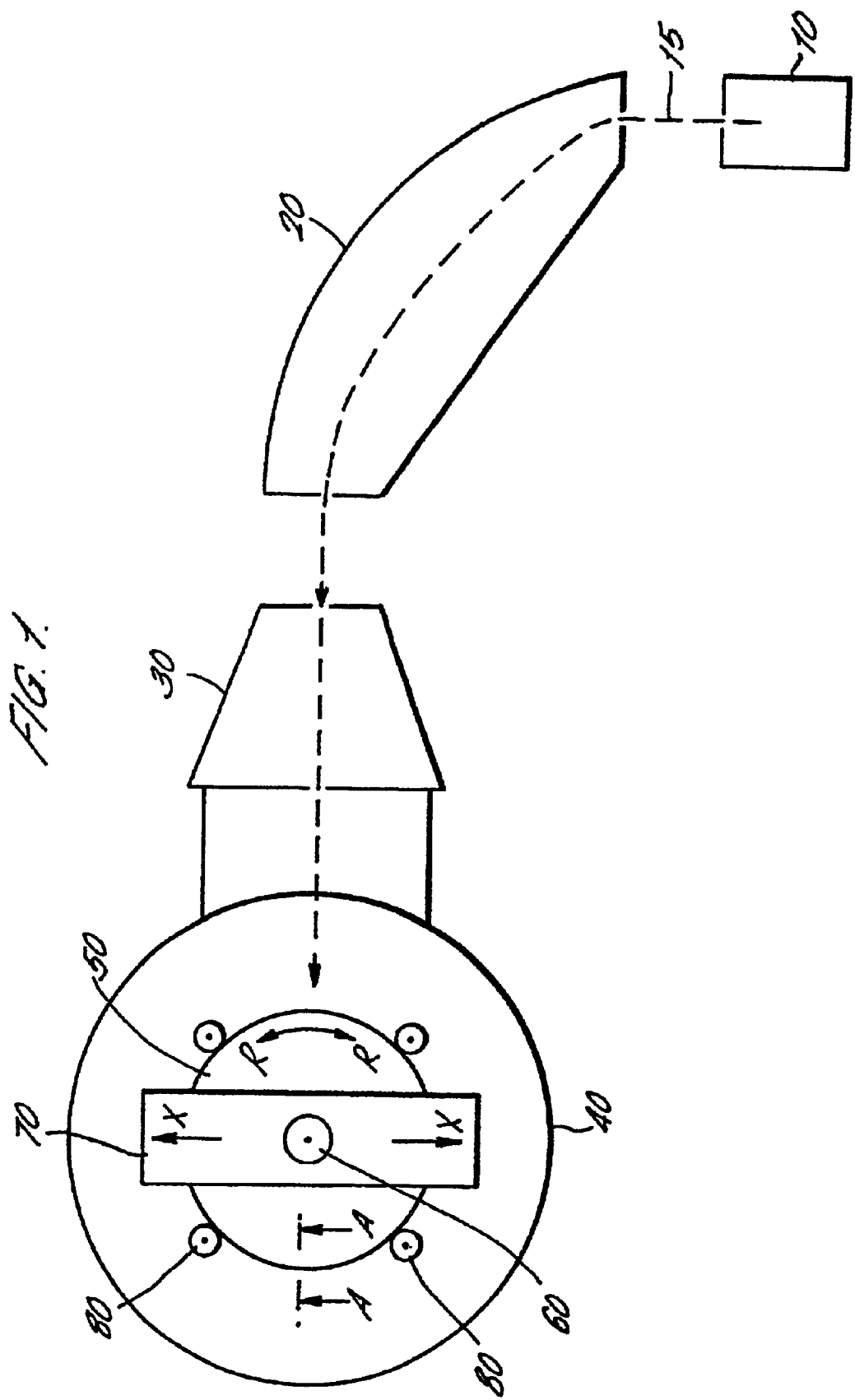
FIG. 1 shows a schematic side view of an ion implanter including a process chamber.

Referring first to FIG. 1, a schematic side view of an ion implanter is shown. The ion implanter includes an ion source 10 which is arranged to generate a (typically collimated) ion beam 15. The ion beam 15 is directed into a mass analyser 20 where ions of a desired mass/charge ratio are selected electromagnetically. Such techniques are well-known to those skilled in the art and will not be detailed further.

The ion beam 15 exits the mass analyser 20 in a generally collimated stream. The ion beam exiting the mass analyser may be subject to electrostatic acceleration or deceleration of the ions, depending upon the type of ions to be implanted and the desired implantation depth.

Downstream of the mass analyser is a process chamber 40 containing a wafer to be implanted. In the present embodiment, the wafer is typically a large single wafer, approximately 300 mm in diameter.

The ion beam which exits the mass analyser 20 generally has a beam width and height which is substantially smaller than the diameter of the wafer to be implanted. It is for this reason that the beam needs to be scanned relative to the wafer. In the preferred embodiment, the ion beam is scanned electrostatically or electromagnetically in the first plane via an electrostatic/electromagnetic scanner 30. In the present example, the ion beam is scanned in a single plane which extends into and out of the page when viewing FIG. 1. The wafer itself is scanned mechanically in a second direction orthogonal to the direction of scanning of the ion beam. To scan the wafer mechanically, the wafer is mounted upon a substrate support. This consists of a plate onto which the wafer is mounted within the process chamber 40, and an elongate arm connected to the plate.

The elongate arm extends out through the wall of the process chamber in a direction generally parallel with the scanning plane of the ion beam. The arm passes through a slot (not shown) in a rotor plate 50 which is mounted adjacent to a side wall of the process chamber 40. The end 60 of the scanning arm is mounted within a scanning member 70. To effect mechanical scanning of the scanning arm (and hence the wafer mounted upon the plate) relative to the electrostatically/electromagnetically scanned ion beam, the scanning member 70 is movable in a reciprocating manner in the direction X shown in FIG. 1. To facilitate this scanning, the undersurface of the scanning member 70 is spaced from the upper surface of the rotor plate 50 by a cushion of compressed air which acts as an air bearing.

The scanning member 70 in FIG. 1 is shown in a vertical position such that the surface of the wafer is perpendicular to the plane of the scanned or fanned instant ion beam. However, it may desirable to implant ions from the ion beam into the wafer at an angle. For this reason, the rotor plate 50 is rotatable about an axis defined through its centre, relative to the fixed wall of the process chamber 40. In other words, the rotor plate 50 is able to rotate in the direction R shown in FIG. 1.

As with the scanning member 70, movement of the rotor plate 50 relative to the wall of the process chamber is facilitated with an air bearing which lies between the lower surface of the rotor plate 50 and the upper surface of a stator (not shown in FIG. 1) mounted upon a flange extending from a wall of the process chamber 40. Radial movement of the rotor plate is constrained by a series of guide wheels 80 arranged around the circumference of the rotor plate 50. Unwanted axial movement of the rotor plate is prevented in use by the pressure differential between the two faces of the rotor plate. In particular, the inside of the process chamber is evacuated to prevent contamination of the wafer and ion beam and a large force due to atmospheric pressure accordingly acts to hold the rotor plate against the stator.

When the rotor plate 50 is rotated, the scanning means 70 is rotated with it so that the arm will then be reciprocated in a plane at an angle to the vertical.

This arrangement is advantageous because the point at which the ion beam impinges on the wafer will always lie in the same vertical plane at a fixed position in the process chamber 40 and thus, uniform ion implantation is achieved. This is in contrast to systems in which the wafer is mounted on the top of an arm having a vertical longitudinal axis and which is only reciprocatable in a vertical plane. In this type of system, if the wafer carried by the arm is positioned at an angle to the vertical then the vertical plane containing the point at which the ion beam impinges on the wafer continuously varies its position within the chamber as the arm reciprocates. This is disadvantageous because the ion concentration of the beam is not uniform along its length and thus non-uniform implantation results.

The mechanical scanning arrangement described above is that described in the aforementioned WO99/13488, assigned to a common assignee, the contents of which are hereby incorporated in their entirety by reference.

Figure 2:
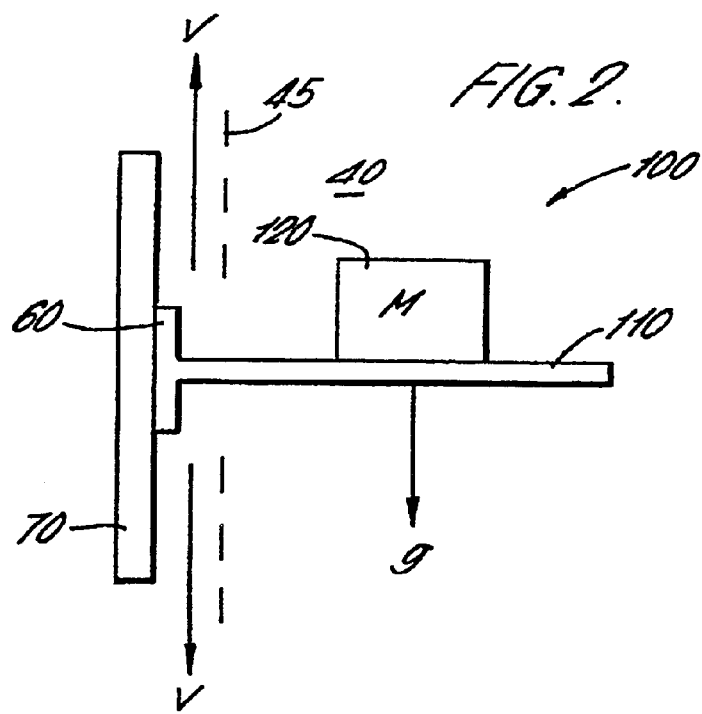
FIG. 2 shows a schematic diagram of the scanning system associated with the ion implanter of FIG. 1.

FIG. 2 shows in schematic form a conventional scanning mechanism 100 as viewed in the direction of arrow A in FIG. 1. The scanning mechanism 100 consists of an elongate arm 110 mounted with its longitudinal axis substantially horizontal in the process chamber 40 and carrying a substrate support 120 to which a wafer is attached for implantation.

The end 60 of the arm 110 distal from the substrate support 120 extends out of the process chamber 40 through an aperture in the wall 45 which is illustrated by the dotted line. The end 60 of the arm 110 is attached to the scanning mechanism 70 which includes a linear motor (not shown) operable to raise and lower the arm 110 and the substrate support 120 in reciprocating vertical motion as indicated by the arrows X with velocity control being as precise as possible. The linear motor is controlled by a servo system (not shown) having position feedback.

The velocity of reciprocating movement is preferably in the order of 40 cm/s with a desired 0.1% accuracy and the desired turnaround time between the upward and downward strokes is in the order of less than 100 ms.

However, the combined mass M of the arm 60 and substrate support 120 is significant, typically in the order of 250 lbs and therefore the effect of gravity g on the mass M is also significant. The requirements of the motor and servo system are complicated by the gravitational pull on the mass M since it is necessary to compensate for its opposing effects in the upward and downward strokes to ensure constant velocity movement. Thus, the motor and servo system must be capable of providing a constant upward force to compensate for the downward gravitational pull. Substantially different servo requirements will also ensue at the turnaround between the upward the downward strokes. A further concern is that in the event of power failure to the motor and servo system, the arm 110 and substrate support 120 will fall under the influence of gravity with an acceleration of g.

Figure 3:
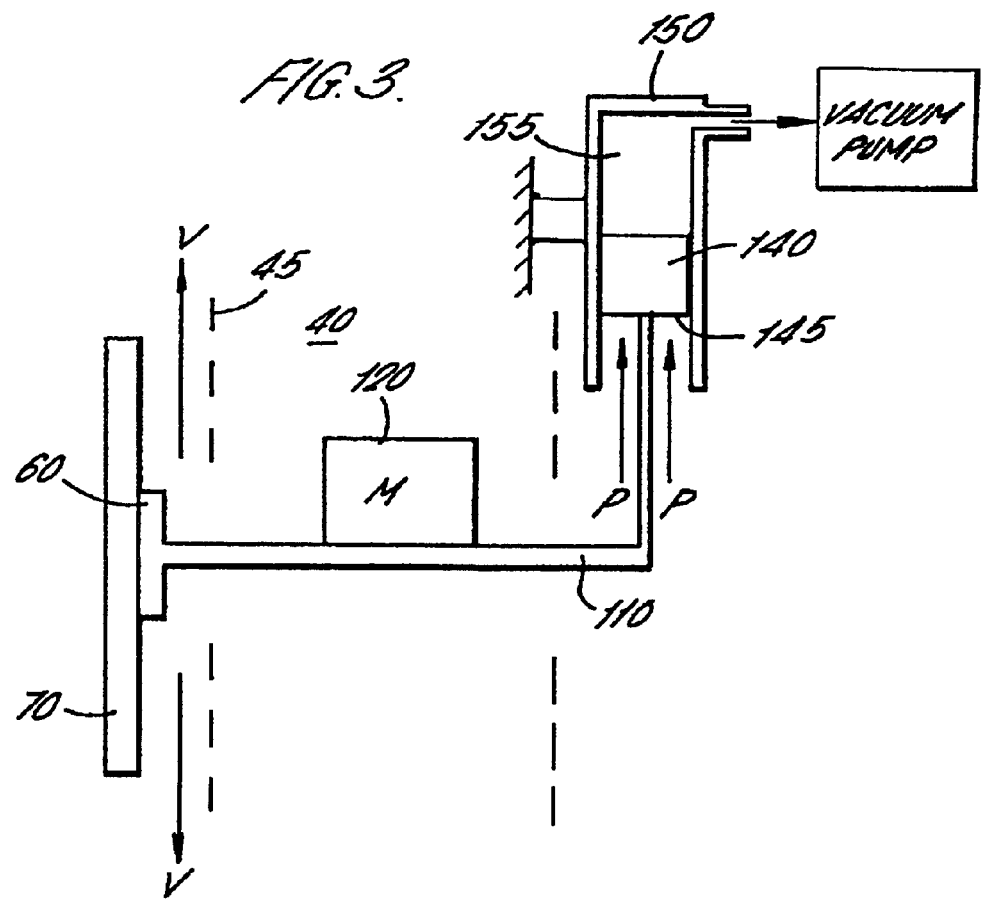
FIG. 3 shows a schematic diagram illustrating the principles of a scanning system according to the present invention.

FIG. 3 shows in schematic form a modified scanning system illustrating the principles of the present invention. The same reference numbers have been used for features which are common to both FIGS. 2 and 3.

In FIG. 3, the arm 110 is attached to a piston 140 located outside the process chamber 40 and slidably received for reciprocating movement in a cylinder 150. The longitudinal axis of the cylinder 150 and piston 140 is parallel with the direction X of reciprocal movement of the arm 110 and scanning means 70.

The lower end of the cylinder 150 is open so that the lower surface 145 of the piston 140 is subject to atmospheric pressure indicated by arrows P. The chamber 155 defined by the cylinder 150 and enclosed by the piston 140 is evacuated. For this purpose, it is not necessary to achieve a particularly high vacuum and a simple vacuum pump (not shown) capable of producing pressures below about 50 Torr is sufficient. However, it is desirable that the change in pressure in the chamber 155 as the piston 140 moves through its complete stroke should be minimal in absolute terms relative to atmospheric pressure. The throughput of the pump will of course depend upon the leakage rate past the piston 140 into the evacuated chamber 155.

The diameter of the piston 140 and hence the cross sectional area of its lower face 145 is selected so that when the cylinder 150 and piston 140 are vertically oriented the upward force acting on the piston 140 as a result of atmospheric pressure reduces or, preferably, substantially equals the downward gravitational force on the combined mass of the arm 110, substrate support 120 and the piston 140. Accordingly, the piston 140 and cylinder 150 assembly provides a counterbalance to reduce or nullify the resultant force acting on the movable stage. As a result, it is no longer necessary for the servo and motor to provide an offset force to counterbalance the gravitational pull and consequently the demands on the motor and servo system are significantly simplified. In particular, the requirements are limited strictly to overcoming inertial effects results from changes in direction at the turnaround between the upward and downward strokes. The problems associated with power failure are also reduced or eliminated.

A further advantage of using a vacuum cylinder is that as the piston moves up and down the only flow of air is in and out of the open end of the cylinder and no valving system is necessary as it would be if an air cylinder or gas spring was used. A vacuum cylinder also does not suffer from the "spongyness" often found with air cylinders.

Although in the schematic diagram of FIG. 3 the piston 140 is shown attached to the arm 110 at a location remote from the end 60 which is attached to the scanning means 70, in practice it is preferred to attach the piston 140 at the end 60 adjacent to the scanning means 70. This avoids the need for both ends of the arm 110 to protrude out of the process chamber 40 and reduces any torque on the arm 110.

Figure 4:
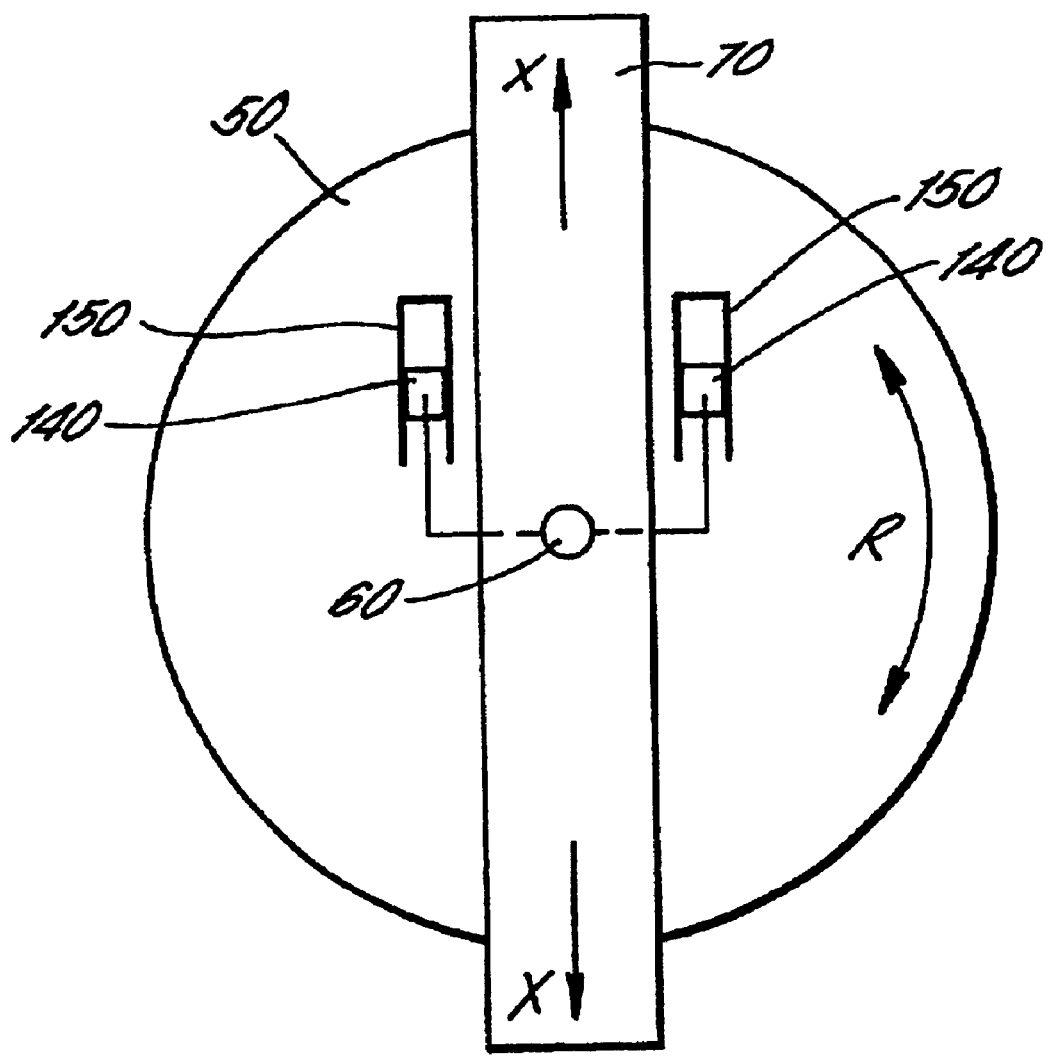
FIG. 4 is a schematic side view of an ion implanter process chamber including apparatus in accordance with one embodiment of the present invention.

FIG. 4 illustrates in schematic form a preferred embodiment of the present invention. As shown, a pair of pistons 140 are attached on either side of the end 60 of the arm 110 adjacent the scanning means 70. The scanning means 70 together with the pistons 140 and the cylinders 150 are mounted on the rotor 50 which, as described above, is rotatable relative to the process chamber 140 in the direction of arrows R. Thus, if the rotor 50 is rotated say, anticlockwise by 10 degrees, the scanning means 70, pistons 140 and cylinders 150 are also rotated so as to lie at 10 degrees to the vertical and the reciprocating motion of the arm 110 and pistons 140 will occur in a plane at 10 degrees to the vertical. In this angled position, the vertical component of the force acting on the pistons 140 as a result of atmospheric pressure may not exactly counterbalance the forces acting on the arm 110 and support substrate 120 due to gravity but the differences are relatively minor and can be accommodated by the linear motor and servo control system.

Figure 5:
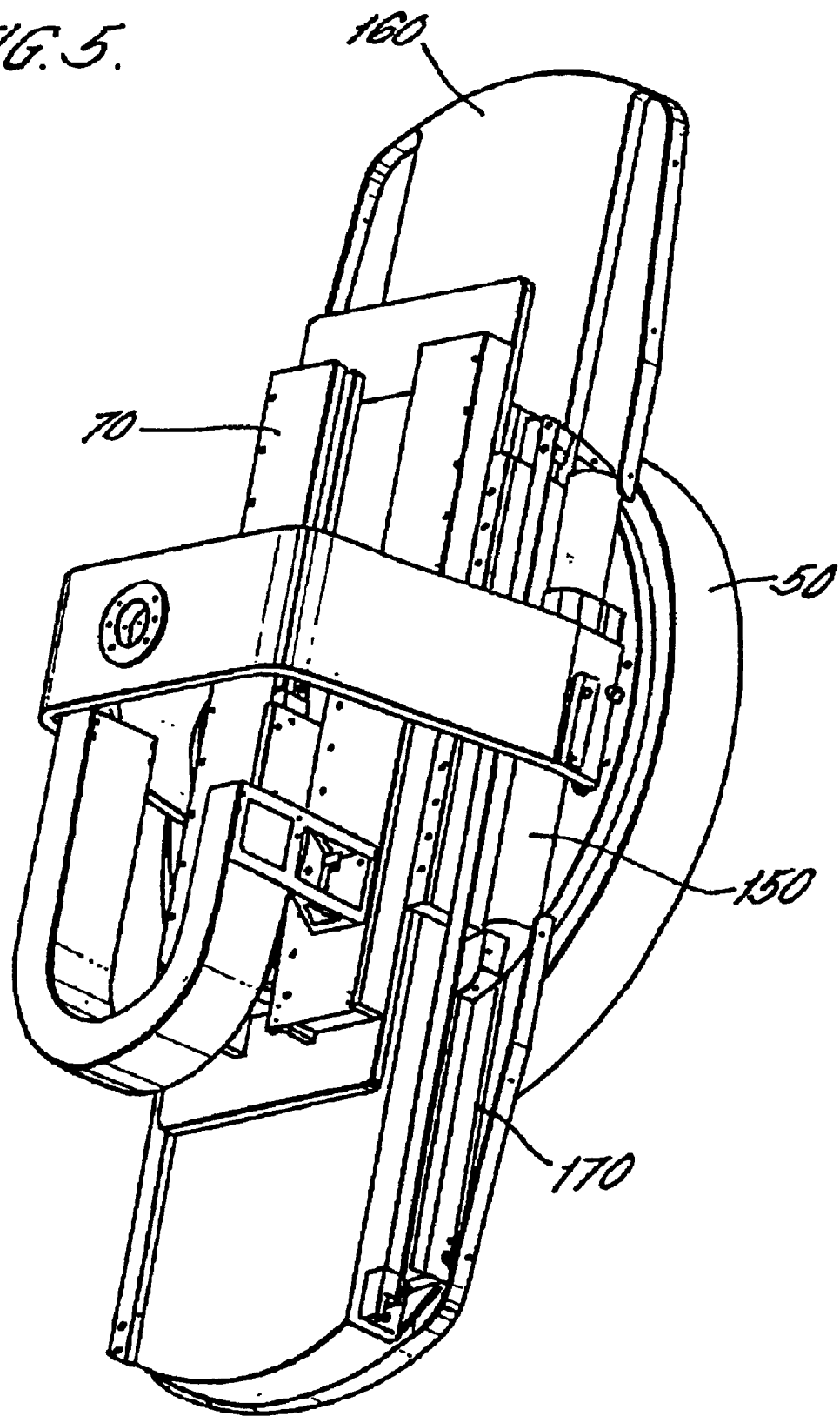
FIG. 5 is a side perspective view of an actual apparatus incorporating the present invention.

FIG. 5 shows in perspective view from one side an actual apparatus incorporating the present invention. The scanning means 70 is reciprocatable along a guide track 160 mounted on the rotor 50. The cylinders 150, only one of which is visible in FIG. 5, are attached to the guide track 160. A connecting rod 170 attaches each piston (not visible in FIG. 5) to the lower end of the scanning means 70. As the scanning means 70 moves up and down the guide track 160, thereby also moving the arm 110, which is attached to it but not visible in FIG. 5, the connecting rods 170 drive the pistons 140 up and down in the cylinders 150.

Whilst the invention has been described above in connection with an ion implanter having a support substrate which is mounted on a horizontal arm and is movable vertically, it will be appreciated that the invention may be employed in other situations in which it is desirable to counterbalance the effect of gravity on a relatively massive structure which must be moved in a precise and controlled manner.

Referring to FIG. 6, a force compensator shown generally at 200 comprises a vacuum cylinder 201 having a closed end 202 and an open end 203. A piston 204 is movable in the cylinder over a stroke which may be defined by arrow 205. The piston 204 defines an enclosed region 206 between the piston and the closed end 202. The open end 203 is open to ambient atmosphere. A source of vacuum 207 is connected to the enclosed region 206 and is arranged to provide in the closed region a vacuum pressure which remains not above about 10% of normal ambient pressure. The vacuum source 207 may be a vacuum pump of sufficient capacity to maintain the enclosed region 206 at the prescribed vacuum pressure. Where the ambient atmosphere is at atmospheric pressure, the vacuum source should be capable of maintaining the enclosed region at not more than about 76 torr. A lower vacuum pressure may be preferred in some circumstances but the vacuum pressure in the enclosed region 206 will not normally be less than about 1 torr. A preferred maximum vacuum pressure is about 50 torr and a more preferred maximum is about 30 torr.

Instead of a vacuum pump for the source 207, the source may comprise an installed vacuum line of adequate capacity and appropriate pressure.

A first connecting link 208 connects the cylinder 201 to a reaction point 209, and a second connecting link 210 connects the piston 204 via a connecting rod 211 to a movable mass 212. In this example, the movable mass 212 is mounted on a track 213 for vertical movement over a displacement range 214. The mass 212 can be driven over the displacement range 214 via a motor drive system, which is not shown, operating on drive wheels 215 running on the track 213.

As will be appreciated, because the displacement direction of the mass 212 is vertical, gravity applies a constant force to the mass 212 in the direction of arrow 216. However, the ambient atmospheric pressure applies an upwards force on the piston 204 in the cylinder 201 which tends to counterbalance or compensate for the force of gravity 216 on the mass 212. Ideally, the cross-sectional area of the piston 204 is selected so that the upward force of ambient atmospheric pressure substantially matches the force of gravity on the force 212, so that the drive system for the mass 212 is required substantially only to accommodate the inertia of the mass 212 when changing the velocity of the mass.

Importantly, because the enclosed region 206 of the cylinder 201 is at a very low pressure relative to ambient atmosphere, the net force on the piston 204 remains substantially constant even if the residual pressure remaining in the enclosed region 206 changes significantly, for example during upwards or downwards movement of the piston in the cylinder.

For example, if the maximum pressure in the enclosed region 206 during movement of the piston 204 upwards and/or downwards in the cylinder 201 is held by the vacuum source 207 to be not more than 10% of ambient atmospheric pressure, then the maximum change in the net upwards force on the piston 204 is 10% of the predetermined or set force on the face of the piston 204 which is exposed to ambient pressure. This set force is of course itself determined by the cross-sectional area of the piston 204 and the value of ambient atmospheric pressure.

Importantly, with this arrangement using a vacuum source such as source 207, there is no requirement to maintain the pressure in the enclosed region 206 constant during movement of the piston 204. Since the residual pressure in the enclosed region 206 is so much less than the ambient pressure, changes in the residual pressure have little effect on the net force applied to the piston 204.

FIG. 7 illustrates a force compensator 200 which has the same structure as the compensator of FIG. 6 and corresponding parts are indicated by the same reference numbers. However in FIG. 7, the orientation of the piston and cylinder combination is reversed, so that the piston 204 is connected to the fixed reaction point 209 by means of the connection link 210, and the cylinder 201 is connected to the movable mass 212 by means of the connection link 208.

Evacuation of the enclosed region 206 applies an upwards compensation force to the mass 212 in the same fashion as the arrangement of FIG. 6. In FIG. 7, the cylinder 201 is movable with the mass 212, and so it may be convenient to connect the vacuum source 207 to the cylinder 201 by means of a flexible connection illustrated generally at 217.

Referring now to FIG. 8, a further configuration of force compensator is illustrated using a piston and cylinder combination 218. The combination 218 is arranged to provide an upwards compensation force on mass 212 by pushing downwards against a reaction point 219. By comparison, the arrangements of FIG. 6 and FIG. 7 provide the upwards compensation force by pulling downwards from the reaction point 209.

In the arrangement of FIG. 8, piston 220 movable in cylinder 221 is connected by a compression link 222 to the reaction point 219. The cylinder 221 is connected by a further compression link 223 to the mass 212. The region 224 above the piston 220 is open to atmosphere and the region 225 below the piston surrounding the connecting rod 222 is enclosed and evacuated by means of a vacuum source 207.

As can be seen, the resulting arrangement can be sized to provide a desired substantially constant upward force on the mass 212, sufficient to counteract the weight of the mass.

It will also be understood that the arrangement illustrated in FIG. 8 requires a vacuum seal 226 where the connecting rod 222 passes through the closed end 227 of the cylinder 221.

Although in FIG. 8, the cylinder is shown connected to the mass 212 and the piston connected to the reaction surface 219, the force compensator 218 could also be operated with the reverse orientation with the piston connected to the mass 212 and the cylinder connected to the reaction surface 219.

All the arrangements of FIGS. 6 to 8 are illustrated as providing a generally upwards compensation force which can be used to compensate the force of gravity on a mass.

FIG. 9 illustrates an arrangement in which a force compensator is aligned substantially horizontally so as to provide an outward force to compensate the inward force of atmospheric pressure on an elongate member which is longitudinally movable into and out of a vacuum chamber.

A vacuum chamber 250 may comprise, for example, the process chamber of a semiconductor processing apparatus. In particular, the vacuum chamber may comprise the process chamber of an ion implanter. An elongate member 251 extends into the vacuum chamber 250 through a vacuum seal 252. The elongate member 251 may carry at its inner end inside the vacuum chamber a holder 253 for holding a semiconductor wafer for processing. The elongate member 251 is driven by means of a drive connection 254 so as to move longitudinally in the direction of arrows 256 so that the wafer holder 253 can be reciprocated to and fro over a range of movement which is illustrated by the arrows 256. Such reciprocation movement may be used for example to pass a process wafer on the holder 253 across an ion beam in the chamber 250.

Because the interior of the chamber 250 is at a hard vacuum, typically less than $10^{-3}$ torr, atmospheric pressure applies an inward force represented by the arrow 255 to the longitudinal member 251.

A force compensator illustrated generally by the arrow 260 is connected between the elongate member 251 and a reaction bar 261 fastened to the wall 262 of the vacuum chamber 250. The force compensator 260 thereby applies an outward force on the elongate member 251 which can compensate for the inwards force of atmospheric pressure.

As can be seen in FIG. 9, the force compensator 260 has the basic structure as illustrated in FIG. 6. Piston 204 is connected via a link 263 to the elongate member 251, and the cylinder 201 is connected to the reaction bar 261. The enclosed region 206 is connected to the vacuum source 207.

It will be appreciated that the arrangement of the force compensator 206 in FIG. 9 could be reversed to have the cylinder 201 connected to the elongate member 251 and the piston 204 connected to the reaction bar 261. Further, instead of the tension type of force compensator as illustrated in FIGS. 6 and 7, a compression type compensator as illustrated in FIG. 8 could be used, in which case the force compensator would be connected between the link 263 and the vacuum chamber wall 262 so as to apply an outward pushing force on the link 263.

Although the force compensator 260 is shown in FIG. 9 aligned horizontally with the horizontal direction of movement of the elongate member 251, other orientations are also possible. For example, if the elongate member 251 of FIG. 10 is aligned vertically so that the atmospheric force is directed upwards, there may be only a partial match between the downwards force of gravity due to the weight of the elongate member 251 and wafer holder 253 and the upwards force of atmospheric pressure. Any mismatch between these forces can be compensated appropriately by an additional force compensator acting in the vertical direction.

A vertically aligned force compensator may also used in the case where the elongate member 251 depends downwards into the vacuum chamber 250, whereupon the force compensator can provide an upwardly directed compensation force to counteract the aggregate downward force of both gravity and atmospheric pressure.

Arrangements in which the elongate member 251 is movable at an acute angle to the horizontal can also be contemplated. Then the force compensator must provide an appropriate compensation for the inwards force of atmospheric pressure aggregated with the component of the force of gravity in the direction of movement.

It may be noted also that for arrangements where the only force to be compensated is the force of gravity, the direction of displacement of the mass to be compensated need not be vertical. Where the mass is movable at an acute angle to the horizontal, a force compensator can be provided to counteract the component of the force of gravity in the direction of movement.

FIG. 10 illustrates in more detail a force compensator for use in the above described embodiments of the invention. A piston 300 is slidable in a cylinder 301. A right-hand end 302 of the cylinder is open to ambient atmosphere. The piston 301 defines an enclosed region 303 to the left side of the piston in the drawing. The enclosed region 303 may be evacuated through a vacuum connection 304. The cylinder 301 has connection points 305 and 306 for fastening the cylinder to the element to be force compensated or to a reaction point, and the piston 300 has a connection point 307 for fastening the piston 300 via a connecting rod 308 to the other of the element to be force compensated and the reaction point.

The cylinder 301 is conveniently formed of a glass/graphite composite material providing a close tolerance high surface finish bore. The piston 300 may be made of high density graphite with an outer diameter matched to the bore of the cylinder 301.

In practice, it is convenient to size the piston 300 so that it is a free fit within the cylinder 301 to minimise friction and wear between the outer surface of the piston and the inner bore of the cylinder. Even in the absence of a vacuum-tight seal between the piston 300 and the cylinder 301, gas leakage past the piston 300 into the evacuated region 303 can be kept to a relatively low level which can be easily accommodated by the vacuum source, e.g. vacuum pump, connected at 304.

Although the present invention has been described with reference to a preferred embodiment, those skilled in the art will recognise that changes may be made in form and detail without departing from the spirit and scope of the invention, which is to be determined in accordance with the appended claims.

What is claimed is:

1. Semiconductor processing apparatus having a base and a movable member, said movable member having a mass and being mounted for reciprocation relative to the base over a displacement range having a vertical component, and a force compensator for applying a substantially constant compensation force to said movable member over said displacement range to compensate at least partially for the force of gravity on said mass of said member, said force compensator comprising, a vacuum cylinder having a closed end and an open end, a piston movable in said cylinder over a stroke, said piston defining an enclosed region between said piston and said closed end, said open end being open to ambient atmosphere, a source of vacuum connected to said enclosed region, said source being arranged to provide in said enclosed region a vacuum pressure which remains not above about 10% of normal ambient pressure, a first connecting point associated with said cylinder, and a second connection point associated with said piston, one of said first and second connecting points being connected to said movable member and the other of said connecting points being connected to said base, whereby movement of said movable member relative to said base over said displacement range causes movement of said piston in said cylinder over said stroke.

2. Apparatus as claimed in claim 1, and further including a vacuum chamber with a chamber wall which is fixed relative to said base, said movable member being elongate and extending through said chamber wall, said displacement range of reciprocation of the member extending in the longitudinal direction of the member whereby ambient pressure outside said chamber applies a longitudinal inwardly directed pressure force on said member over said displacement range, said compensation force compensating for the combined effect of said force of gravity and said pressure force.

3. Semiconductor processing apparatus having a vacuum chamber with a chamber wall, and a movable elongate member extending through said chamber wall and being mounted for reciprocation relative to said chamber wall in a longitudinal direction of the member over a displacement range, whereby ambient pressure outside said chamber applies a longitudinal inwardly directed pressure force on said member over said displacement range, and a force compensator for applying a substantially constant compensation force to said movable member over said displacement range to compensate at least partially for said pressure force, said force compensator comprising, a vacuum cylinder having a closed end and an open end, a piston movable in said cylinder over a stroke, said piston defining an enclosed region between said piston and said closed end, said open end being open to ambient atmosphere, a source of vacuum connected to said enclosed region, said source being arranged to provide in said enclosed region a vacuum pressure which remains not above about 10% of normal ambient pressure, a first connecting point associated with said cylinder, and a second connection point associated with said piston, one of said first and second connecting points being connected to said elongate movable member and the other of said connecting points being connected to said chamber wall, whereby movement of said elongate member relative to said chamber wall over said displacement range causes movement of said piston in said cylinder over said stroke.

4. A force compensator for applying a substantially constant force over a predetermined displacement range, the compensator comprising, a vacuum cylinder having a closed end and an open end, a piston movable in said cylinder over a stroke, said piston defining an enclosed region between said piston and said closed end, said open end being open to ambient atmosphere, a source of vacuum connected to said enclosed region, said source being arranged to provide in said enclosed region a vacuum pressure which remains not above about 10% of normal ambient pressure, a first connecting point associated with said cylinder, and a second connection point associated with said piston, whereby relative displacement of said first and second connecting points over said displacement range causes movement of said piston in said cylinder over said stroke.

5. A force compensation as claimed in claim 4, wherein ambient pressure is normal atmospheric and said vacuum pressure remains not above about 50 torr.

6. A force compensation as claimed in claim 5, wherein said vacuum pressure remains not above about 30 torr.

7. A force compensation as claimed in claim 4, wherein said vacuum pressure remains above about 1 torr.

8. A force compensator for applying a substantially constant force over a predetermined displacement range, the compensator comprising, a vacuum cylinder having a closed end and an open end, a piston movable in said cylinder over a stroke, said piston defining an enclosed region between said piston and said closed end, said open end being open to ambient atmosphere, a source of vacuum connected to said enclosed region, said source being arranged to provide in said enclosed region a vacuum pressure which remains not above a percentage of normal ambient pressure which is sufficiently small that said force applied remains within about 10% of a desired force, a first connecting point associated with said cylinder, and a second connection point associated with said piston, whereby relative displacement of said first and second connecting points over said displacement range causes movement of said piston in said cylinder over said stroke.

* * * * *